United States Patent
Boemler

(10) Patent No.: US 9,674,471 B1
(45) Date of Patent: Jun. 6, 2017

(54) DIGITAL UNIT CELL WITH BIDIRECTIONAL RIPPLE COUNTER

(71) Applicant: RAYTHEON COMPANY, Waltham, MA (US)

(72) Inventor: Christian M. Boemler, Goleta, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/079,631

(22) Filed: Mar. 24, 2016

(51) Int. Cl.
| | |
|---|---|
| H04N 5/374 | (2011.01) |
| H04N 5/335 | (2011.01) |
| H04N 5/378 | (2011.01) |
| H03K 23/58 | (2006.01) |
| H04N 5/3745 | (2011.01) |

(52) U.S. Cl.
CPC ......... *H04N 5/37455* (2013.01); *H03K 23/58* (2013.01); *H04N 5/378* (2013.01)

(58) Field of Classification Search
CPC .. H04N 5/37455; H04N 5/378; H04N 5/3355; H03K 23/58; G09C 1/00; G11B 20/0021
USPC ......... 348/308, 294; 341/155–158, 187, 164, 341/161, 141; 250/208.1; 257/291, 292; 377/111, 114, 52, 116; 438/57
See application file for complete search history.

(56) References Cited

U.S. PATENT DOCUMENTS

| | | | |
|---|---|---|---|
| 6,965,407 B2* | 11/2005 | Boemler | H03M 1/123 250/208.1 |
| 7,095,355 B1* | 8/2006 | Graham | H03M 1/145 250/208.1 |
| 8,618,974 B2* | 12/2013 | Itzhak | H04N 5/3765 341/120 |
| 9,154,713 B2 | 10/2015 | Denham et al. | |
| 9,491,389 B2* | 11/2016 | Kelly | G11B 20/00086 |
| 2006/0012696 A1* | 1/2006 | Zarnowski | H03M 1/123 348/294 |
| 2007/0075888 A1* | 4/2007 | Kelly | H03M 1/145 341/155 |
| 2008/0001065 A1* | 1/2008 | Ackland | H04N 5/3559 250/208.1 |
| 2010/0140732 A1* | 6/2010 | Eminoglu | H01L 27/14634 257/447 |
| 2010/0194956 A1* | 8/2010 | Yuan | H04N 5/335 348/308 |

(Continued)

*Primary Examiner* — Tuan Ho
*Assistant Examiner* — Marly Camargo
(74) *Attorney, Agent, or Firm* — Lando & Anastasi, LLP

(57) ABSTRACT

Aspects and embodiments are directed to a digital unit cell comprising an integrator circuit, a dynamic comparator configured to compare an integration voltage of the integrator circuit with a reference voltage, provide a first pulse signal each time the integration voltage is less than the reference voltage, and provide a second pulse signal each time the integration voltage exceeds the reference voltage, a multiplexer configured to receive a count direction control signal, and a counter element configured to increment a count value each time the first pulse signal or the second pulse signal is received, wherein the multiplexer is configured to couple a first output of the dynamic comparator to the counter element when the count direction control signal is in a first state, and to couple a second output of the dynamic comparator to the counter element when the count direction control signal is in a second state.

20 Claims, 5 Drawing Sheets

(56) References Cited

U.S. PATENT DOCUMENTS

2010/0225796 A1\* 9/2010 Lim .................... H03M 1/0607
348/308

\* cited by examiner

DIGITAL UNIT CELL WITH BIDIRECTIONAL RIPPLE COUNTER

BACKGROUND

There are many different types of image capturing devices such as digital cameras, video cameras, or other photographic and/or image capturing equipment. These image capturing devices may use image sensors to capture images from a desired scene. For example, an image sensor may include an array of unit cells (i.e., a focal plane array) that receives light via a lens. The received light causes each unit cell in the array to accumulate an electric charge proportional to the light intensity at its location.

A focal plane array typically includes a two-dimensional array of unit cells organized by columns and rows. It is common for a circuit or imager within a unit cell to accumulate charge from a photo-diode, the charge corresponding to the flux of light of various wavelengths incident on the photo-diode. Often, the charge is accumulated on a capacitive element which effectively integrates charge, producing a voltage that corresponds to the intensity of the flux over a given time interval called an integration interval or integration period.

Each unit cell in a focal plane array generally corresponds to a picture element, or pixel, in the final image of the desired scene. A pixel is considered the smallest portion of a digital image. A digital image is generally made up of an array of pixels. Circuitry coupled to the image capturing device may perform post light capture processing steps to convert the accumulated charges from each unit cell into pixel information. This information may include the color, saturation, brightness, or other information that a digital image storage format may require. Digital images may be stored in formats such as .JPG, .GIF, .TIFF, or any other suitable format.

In a traditional analog unit cell, a well capacitor is coupled to a detector diode. The well capacitor integrates photocurrent from the detector diode over an integration interval (e.g., 10 µs). Once per frame, the voltage on the well capacitor is transferred to a sample-and-hold capacitor and then transferred out, line by line, to an Analog to Digital Converter (ADC) which converts the voltage to a binary value. However, as unit cell sizes have decreased, the ability of the well capacitor to store an effective amount of charge has diminished.

Traditional "digital" unit cells provide for the Analog to Digital Conversion (ADC) of accumulated charge. In-unit cell Analog to Digital Conversion (ADC) imaging offers improved photo-charge capacity even as the desired size of unit cells continues to shrink (e.g., below 15 microns). For example, a traditional digital unit cell design includes a quantizing analog front end circuit which accumulates charge over a relatively small capacitor and is reset (i.e., discharged) each time a threshold charge is stored on the capacitor. The pattern of charging and resetting is repeated as more photo-current integrates. Each reset event is "accumulated" (i.e., counted) with a digital counter circuit. Each frame, a global snapshot is taken by copying the digital counter contents to a snapshot register and then reading the snapshot registers out, line by line. The effect is to exponentially increase well capacity of the imager while maintaining a relatively small unit cell size.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

SUMMARY

Figure 1:
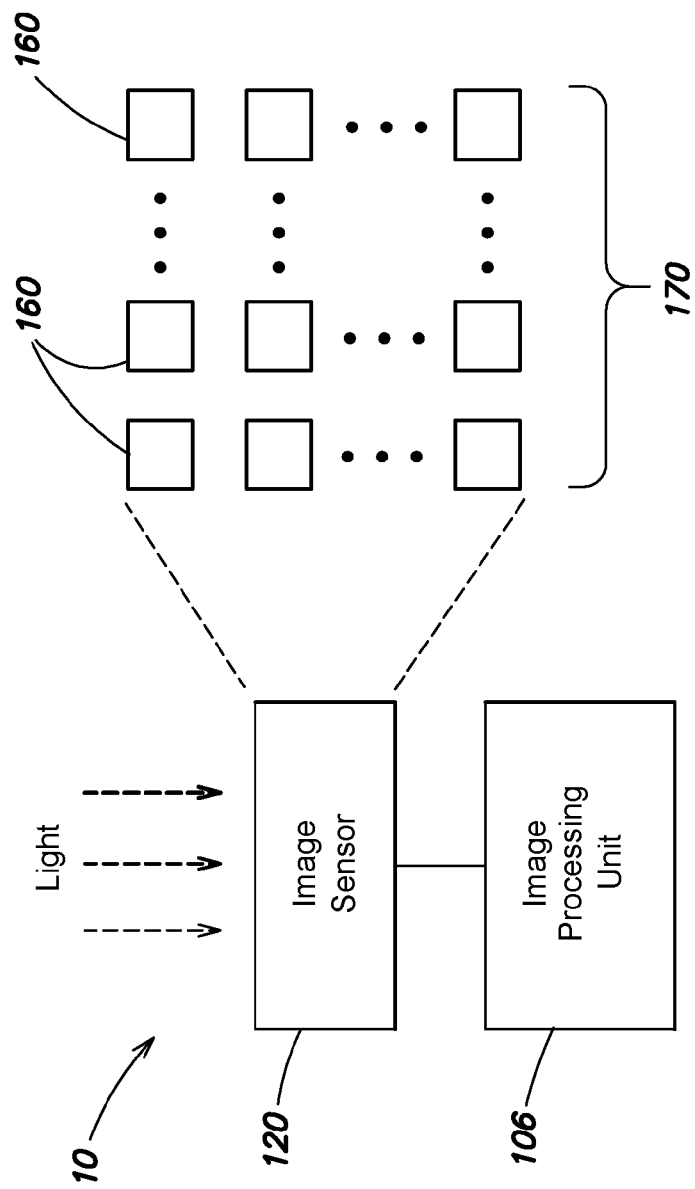
FIG. 1 is a block diagram illustrating an image capture device according to aspects of the invention.

A digital unit cell is provided that includes a relatively small, and low power, bidirectional ripple counter capable of both incrementing and decrementing a count value. A counter direction signal provided to the digital unit cell controls whether the digital unit cell is in a count-up or count-down state. In response to the counter direction signal indicating that the digital unit cell is in a count-up state, a count value of the ripple counter is incremented each time an integration voltage exceeds a threshold. In response to the counter direction signal indicating that the digital unit cell is in a count-down state, the count value of the ripple counter is incremented each time a determination is made that the integration voltage does not exceed the threshold. By subtracting a global correction term of a sub-frame (i.e., the number of pulses during the sub-frame at which the count direction signal provided to the digital unit cell indicated a count-down state) from the count value read-out from the ripple counter, the actual count value of the digital unit cell can be determined.

Aspects and embodiments are directed to a digital unit cell comprising an integrator circuit configured to accumulate charge in response to radiation incident on the integrator circuit over an integration period, a dynamic comparator coupled to the integrator circuit, the dynamic comparator including a first output and a second output and configured to compare an integration voltage of the integrator circuit with a reference voltage over the integration period, provide a first pulse signal to the first output each time a determination is made that the integration voltage is less than the reference voltage, and provide a second pulse signal to the second output each time a determination is made that the integration voltage exceeds the reference voltage, a multiplexer coupled to the first output and the second output of the dynamic comparator and configured to receive a count direction control signal, and a counter element coupled to the multiplexer and configured to increment a count value each time the first pulse signal or the second pulse signal is received from the dynamic comparator over the integration period, wherein the multiplexer is configured to couple the first output of the dynamic comparator to the counter element in response to the count direction control signal being in a first state, and to couple the second output of the dynamic comparator to the counter element in response to the count direction control signal being in a second state.

According to one embodiment, the counter element is a ripple counter. In another embodiment, the digital unit cell further comprises a latch coupled to the counter element and configured to store the count value of the counter element in response to receiving a transfer control signal at an end of the integration period. In one embodiment, the counter element is further configured to reset the count value to zero in response to receiving a reset control signal at the end of the integration period. In one embodiment, the digital unit cell further comprises an image processing unit coupled to the counter selection circuit and configured to transmit the counter selection control signal to the counter selection circuit, receive the count value from the counter selection circuit, and calculate an actual count value of the digital unit cell based on the count value of the counter element and a global correction term.

According to another embodiment, the image processing unit is further configured to transmit the count direction control signal to the multiplexer. In one embodiment, the dynamic comparator is further configured to receive a clock signal including periodic pulses over the integration period and to compare the integration voltage of the integrator circuit with the reference voltage each time one of the pulses of the clock signal is received. In another embodiment, the global correction term is a number of pulses of the clock signal over the integration period at which the count direction control signal was in the first state. In one embodiment, in calculating the actual count value of the digital unit cell, the image processing unit is further configured to subtract the number of pulses over the integration period at which the count direction signal was in the first state from the count value.

According to one embodiment, the digital unit cell further comprises a counter selection circuit coupled to the latch and configured to provide the count value stored in the latch in response to receiving a counter selection control signal. In another embodiment, the digital unit cell further comprises a charge subtraction circuit coupled to the second output of the dynamic comparator and to the integrator circuit, the charge subtraction circuit configured to remove the accumulated charged from the integrator circuit in response to receiving the second pulse signal from the dynamic comparator.

Another aspect of the invention is directed to a method for operating a digital unit cell comprising an integrator circuit, the method comprising generating charge in response to radiation incident on the integrator circuit over an integration period, accumulating the charge on an integration node of the integrator circuit, comparing an integration voltage across the integration node with a reference voltage over the integration period, generating a first pulse signal each time a determination is made that the integration voltage is less than the reference voltage, generating a second pulse signal each time a determination is made that the integration voltage is greater than the reference voltage, receiving a count direction control signal, incrementing, in response to the count direction control signal being in a first state, a count value of a counter element each time the first pulse signal is generated, and incrementing, in response to the count direction control signal being in second state, the count value of a counter element each time the second pulse signal is generated.

According to one embodiment, the method further comprises storing, at an end of the integration period, the count value. In one embodiment, the method further comprises resetting, at the end of the integration period, the count value to zero. In another embodiment, the method further comprises reading-out the stored count value to an image processing unit. In one embodiment, the method further comprises calculating, with the image processing unit, an actual count value of the digital unit cell based on the read-out count value and a global correction term. In another embodiment, comparing the integration voltage across the integration node with the reference voltage includes receiving a clock signal including periodic pulses over the integration period, and comparing the integration voltage with the reference voltage at each pulse of the clock signal. In one embodiment, calculating the actual count value of the digital unit cell based on the read-out count value and the global correction term includes calculating the actual count value of the digital unit cell by subtracting a number of clock pulses over the integration period at which the count direction signal was in the first state from the count value.

According to another embodiment, the method further comprises removing the accumulated charged from the integration node in response to generating the second pulse signal.

Another aspect of the invention is directed to an image sensor comprising an image processing unit, and an array of unit cells coupled to the image processing circuit, each unit cell comprising an integrator circuit configured to accumulate charge in response to radiation incident on the integrator circuit over an integration period, a dynamic comparator coupled to the integrator circuit, the dynamic comparator including a first output and a second output and configured to compare an integration voltage of the integrator circuit with a reference voltage over the integration period, provide a first pulse signal to the first output each time a determination is made that the integration voltage is less than the reference voltage, and provide a second pulse signal to the second output each time a determination is made that the integration voltage exceeds the reference voltage, and means for maintaining a counter value based on any received first pulse signals from the dynamic comparator, any received second pulse signals from the dynamic comparator, and a count direction control signal received from a controller; wherein the image processing unit is configured to read-out the counter value from each unit cell and calculate an actual count value of each unit cell based on the counter value of each unit cell and a global correction term.

DETAILED DESCRIPTION OF THE INVENTION

As discussed above, an image sensor of an image capture device may include an array of analog or digital unit cells that is configured to receive light from a desired scene. The received light causes each unit cell in the array to accumulate an electric charge proportional to the light intensity at its location and image processing circuitry coupled to each unit cell converts the accumulated charges into image information corresponding to the desired scene.

Digital unit cells integrate charge similar to analog unit cells; however, when an integrated charge of a digital unit cell exceeds a maximum level, additional circuitry inside the digital unit cell removes the integrated charge while incrementing a separate counter value. After the integration charge is removed (and the counter incremented), the integration of charge in the digital unit cell begins again.

Digital unit cells typically utilize counting elements that are configured to increment a count value each time the integration node is reset (i.e., each time the charge is removed from the unit cell). However, in some situations, it may be beneficial for the counting element of a digital unit cell to be able to both increment and decrement a count value. For example, in a motion detection system utilizing digital unit cells, the accuracy of the motion detection system viewing a desired scene can be improved if the digital unit cells are capable of both incrementing a count value in response to the resetting of an integration node and decrementing a count value to account for known variables (e.g., a pulsing laser, an object) in the desired scene.

Traditional up/down counters are relatively large and include too much combinatorial circuitry to fit within a relatively small unit cell. Accordingly, aspects and embodiments described herein are directed to a digital unit cell that includes a relatively small bidirectional ripple counter capable of both incrementing and decrementing a count value. Ripple counters are normally only capable of counting up; however, the bidirectional ripple counter described herein is capable of either counting up or down, depending on the state of a count direction signal.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

FIG. 1 is a block diagram illustrating an image capture device 10 that may be used to capture images according to aspects described herein. For example device 10 may be a digital camera, video camera, or other photographic and/or image capturing equipment. Image capture device 10 comprises image sensor 120 and image processing unit 106. Image sensor 120 may be an Active Pixel Sensor (APS) or other suitable light sensing device that can capture images. Image processing unit 106 may be a combination of hardware, software, and/or firmware that is operable to receive signal information from image sensor 120 and convert the signal information into a digital image.

Image sensor 120 includes an array 170 of unit cells 160. Each unit cell 160 accumulates charge proportional to the light intensity at that location in the field of view and provides an indication of the intensity of light at that location to the image processing unit 106. Each unit cell 160 may correspond to a pixel in the captured electronic image.

A particular method for image capture using image capture device 10 may involve ripple capture, ripple read, and ripple reset operations. A ripple capture operation exposes each rose of unit cells from image sensor 120 to light in order. For example, a ripple capture operation may expose the top row of unit cells of image sensor 120 to light, followed by the second row, followed by the third row, and so forth until the last row of unit cells of image sensor 120 is exposed to light. A ripple read operation processes the light captured by each row of unit cells from image sensor 120 in order. Similar to ripple capture, ripple read may process the top row of unit cells of image sensor 120, followed by the second row, followed by the third row, and so forth until the last row of unit cells of image sensor 120 is processed. A ripple reset operation to reset the rows of unit cells of image sensor 120 may be performed similarly.

The ripple capture, ripple read, and ripple reset operations are typically performed on consecutive rows. For example, a ripple capture operation may begin with the first row of image sensor 120. As the ripple capture operation moves to the second row, a ripple read operation may begin on the first row of image sensor 120. After the ripple capture operation moves to the third row, the ripple read operation may begin on the second row and a ripple reset operation may begin on the first row. This may continue until the last row is processed. Once the last row is processed, the image may be processed, stored, and/or transmitted by the image processing unit 106.

Figure 2:
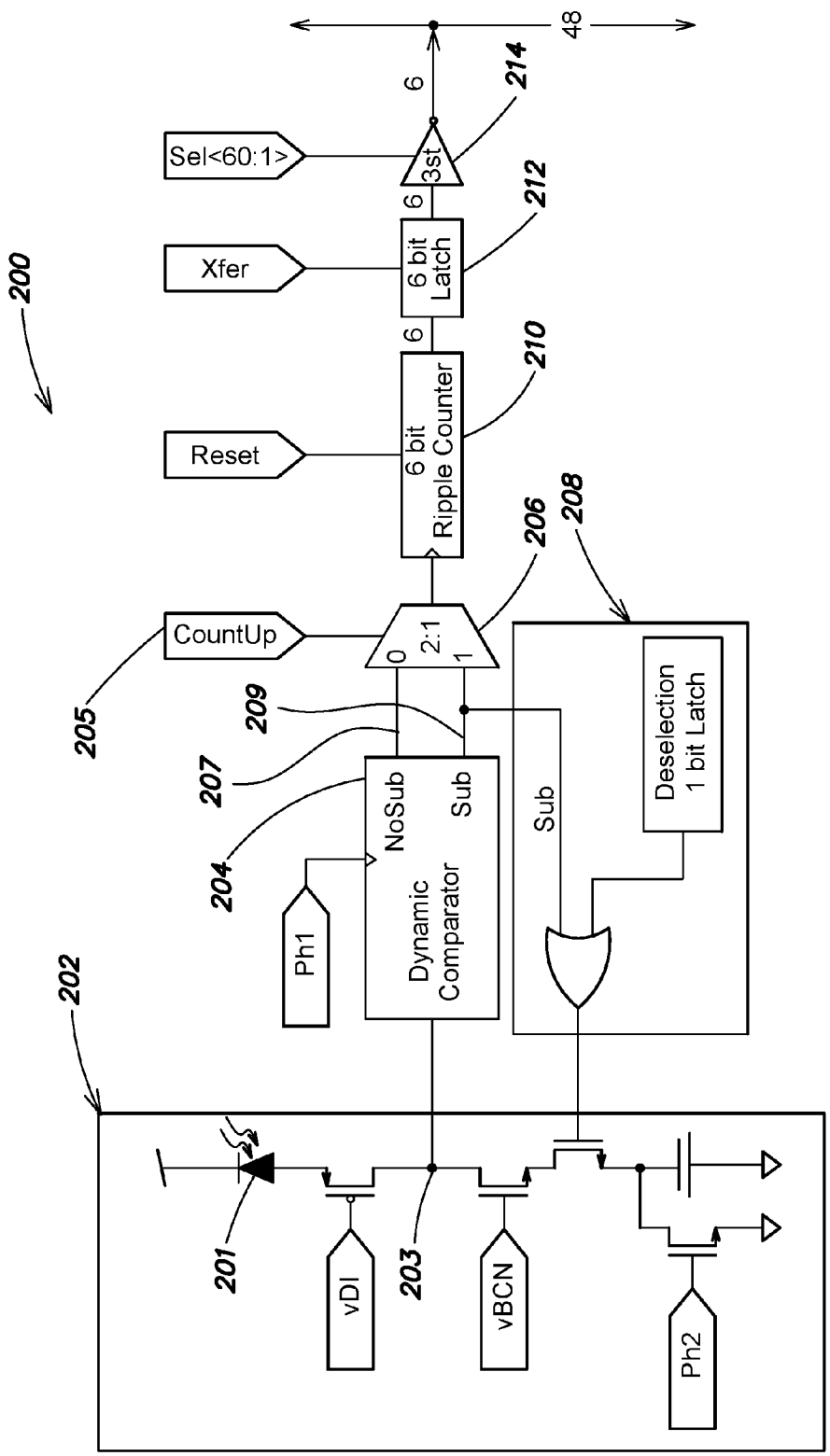
FIG. 2 is a block diagram illustrating a digital unit cell according to aspects of the invention.

FIG. 2 is a block diagram illustrating a digital unit cell 200 according to aspects described herein. The digital unit cell 200 is included in at least one of the unit cells 160 and includes an integrator circuit 202, dynamic comparator 204, a multiplexer 206, a charge subtraction circuit 208, a ripple counter 210, a latch 212, and a counter selection circuit 214. The integrator circuit 202 includes a photodiode 201 coupled to an integration node 203. The integration node 203 is coupled to an input of the dynamic comparator 204. A first output 207 of the dynamic comparator 204 is coupled to a first input terminal of the multiplexer 206. A second output 209 of the dynamic comparator 204 is coupled to a second input terminal of the multiplexer 206. The second output of the dynamic comparator 204 is also coupled to an input of the charge subtraction circuit 208. An output of the charge subtraction circuit 208 is coupled to the integrator circuit 202. An output of the multiplexer 206 is coupled to an input of the ripple counter 210. An output of the ripple counter 210 is coupled to an input of the latch 212. An output of the latch is coupled to an input of the counter selection circuit 214. An output of the counter selection circuit 214 is configured to be coupled to the image processing circuit 106.

Figure 3:
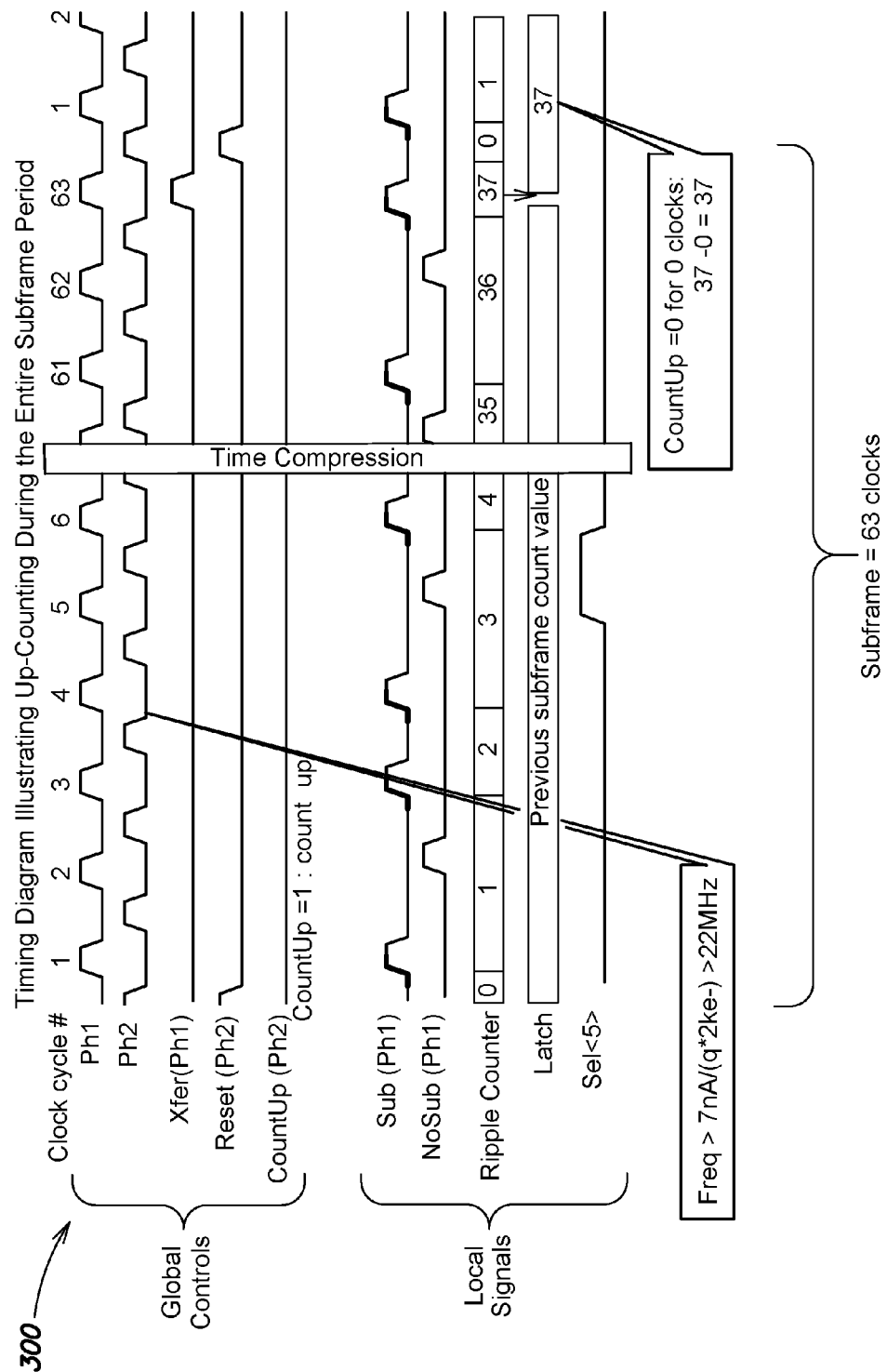
FIG. 3 includes a timing diagram illustrating count-up operation of a digital unit cell circuit according to aspects of the invention.
Figure 4:
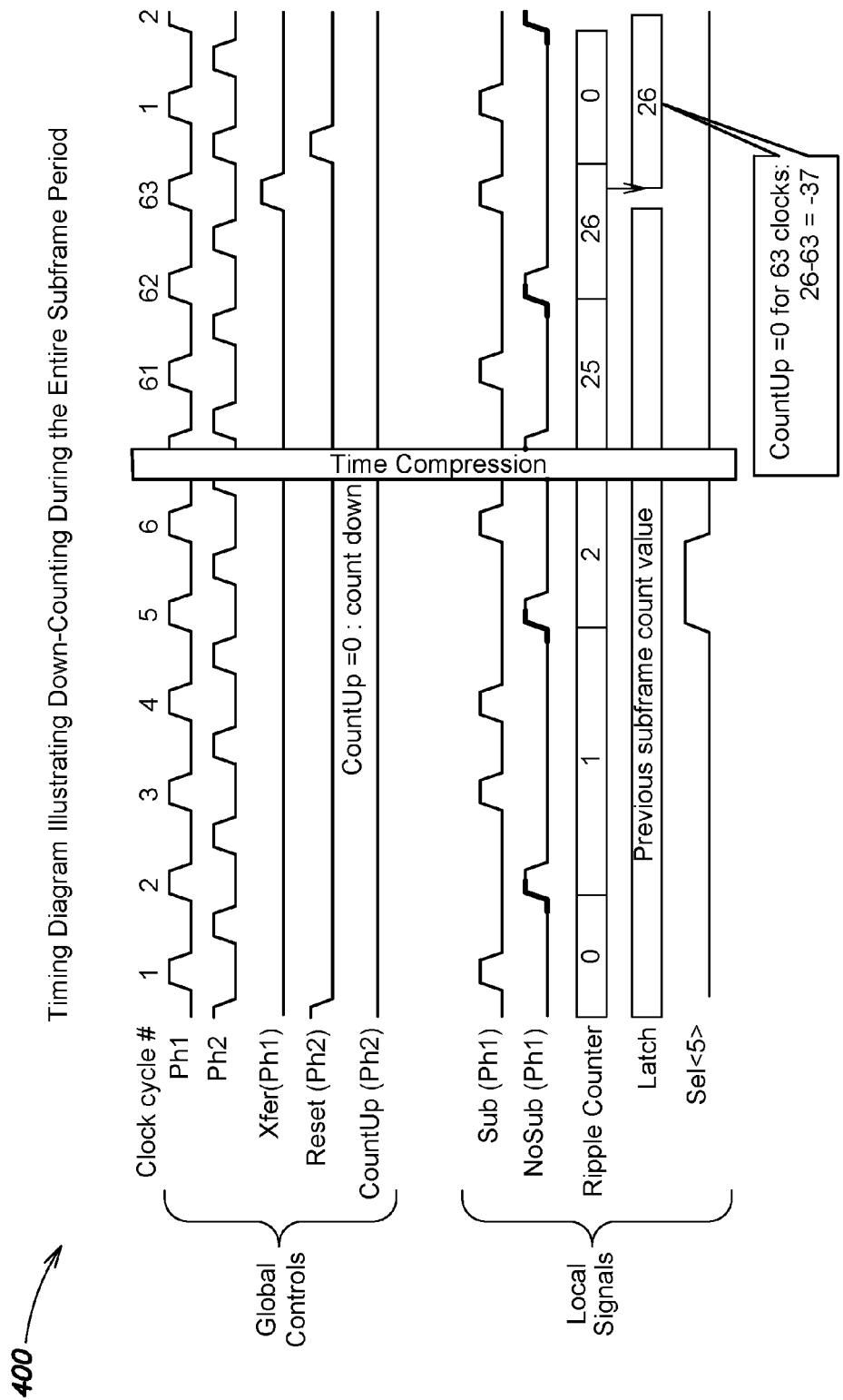
FIG. 4 includes a timing diagram illustrating count-down operation of a digital unit cell circuit according to aspects of the invention.
Figure 5:
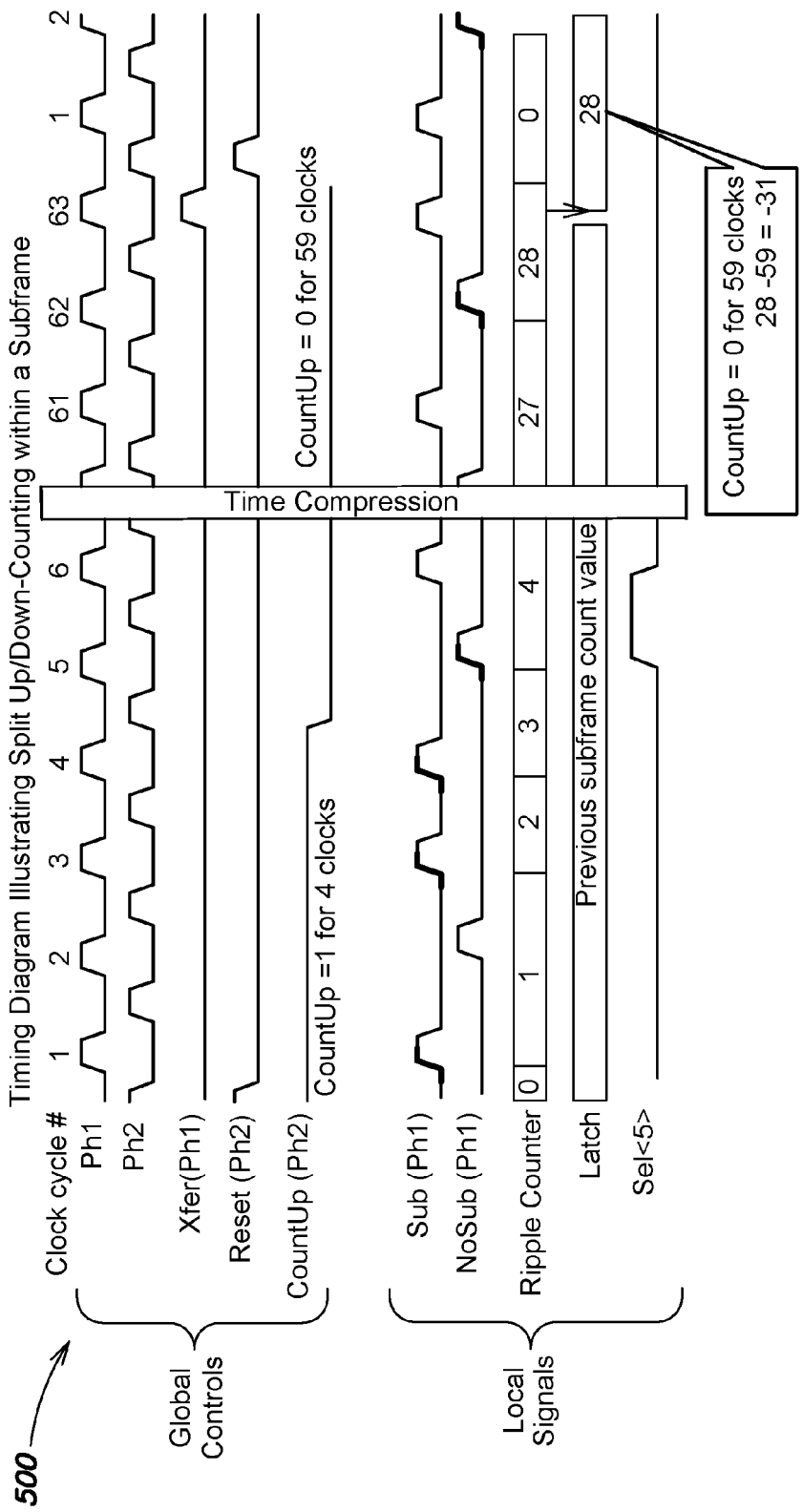
FIG. 5 includes a timing diagram illustrating count-up and count-down operation of a digital unit cell circuit according to aspects of the invention.

Operation of the digital unit cell 200 is described below with respect to FIGS. 3-5. FIGS. 3-5 include timing diagrams of different signals during operation of the digital unit cell 200 according to different embodiments. FIG. 3 includes a timing diagram 300 illustrating only up-counting by the digital unit cell 200 during a sub-frame (i.e., integration period). FIG. 4 includes a timing diagram 400 illustrating only down-counting by the digital unit cell 200 during a sub-frame period. FIG. 5 includes a timing diagram 500 illustrating both up-counting and down-counting by the digital unit cell 200 during a sub-frame period. Each timing diagram 300, 400, 500 includes a first trace representing a first clock signal (Ph1), a second trace representing a second clock signal (Ph2), a third trace representing a transfer control signal (Xfer), a fourth trace representing a reset control signal (Reset), a fifth trace representing a count direction control signal (CountUp), a sixth trace representing a signal (NoSub) provided at the first output 207 of the comparator 204, a seventh trace representing a signal (Sub) provided at the second output 209 of the comparator 204, an eighth trace representing a count value of the ripple counter 210, a ninth trace representing the value stored in the latch 212, and a tenth trace representing a counter selection control signal (Sel<5>).

Referring to FIGS. 3-5, at the beginning of a sub-frame (i.e., beginning of an integration period), the Reset signal is high and a count value of the ripple counter 210 is set to zero. Also at the beginning of the integration period, optical radiation (e.g., an input light signal) from a scene is incident on the photodiode 201 of the integrator circuit 202, a resulting photocurrent from the photodiode 201 is provided to the integration node 203 and charge corresponding to the flux of the optical radiation incident on the photodiode 201 accumulates on the integration node 203. As charge accumulates on the integration node 203, the voltage across the integration node 203 increases.

After the Reset signal goes low, the first clock signal Ph1 operates the comparator 204 to compare, at each clock pulse, the voltage on the integration node 203 with a reference voltage. At each clock pulse, in response to a determination that the voltage on the integration node 203 is less than the reference voltage, the comparator outputs a high pulse (NoSub) on the first output 207 of the dynamic comparator 204 and in response to a determination that the voltage on the integration node 203 is greater than the reference voltage, the comparator outputs a high pulse (Sub) on the second output 209 of the dynamic comparator 204.

The high pulse (Sub) on the second output 209 of the dynamic comparator 204 is provided to the charge subtraction circuit 208. In response to receiving the high pulse (Sub) from the dynamic comparator 204, the charge subtraction circuit 208 operates the integrator circuit 202 to remove the charge stored on the integration node 203. After the charge stored on the integration node 203 is removed, the integrator circuit 202 can again accumulate charge generated by the photodiode 201 in response to radiation incident on the photodiode 201.

The multiplexer 206 receives a count direction control signal (CountUp) 205. According to one embodiment, the CountUp signal 205 is provided to the multiplexer 206 by the image processing unit 106; however, in other embodiments, the CountUp signal 205 is provided to the multiplexer from some other controller in communication with the digital unit cell 200. The image processing unit 106 (or different controller) provides the CountUp signal 205 to the multiplexer 206 to operate the digital unit cell 200 to either count up or count down based on the type of counting the image processing unit 106 desires at that time. For example, at any given time during a sub-frame, the controller may desire the digital unit cell 200 to decrement a count value to account for a known variable (e.g., a pulsing laser, known object, etc.) in a scene being viewed by the digital unit cell 200. The image processing unit 106 (or different controller) provides the count direction control signal to each unit cell 200 in the image sensor 120.

For example, in at least one embodiment, in response to receiving a high CountUp signal 205, the multiplexer 206 couples the second output 209 of the comparator 204 to the ripple counter 210 and each time the ripple counter 210 receives a high pulse (Sub) from the second output 209 of the dynamic comparator 204 (via the multiplexer 206) indicating that the voltage on the integration node 203 has exceeded the reference voltage, the ripple counter 210 increments its count value. Alternatively, in response to receiving a low CountUp signal 205, the multiplexer 206 couples the first output 207 of the comparator 204 to the ripple counter 210 and each time the ripple counter 210 receives a high pulse (NoSub) from the first output 207 of the dynamic comparator 204 (via the multiplexer 206) indicating that the voltage on the integration node 203 is less than the reference voltage, the ripple counter 210 increments its count value. According to one embodiment, the ripple counter is a 6-bit ripple counter; however, in other embodiments, the ripple counter may be of any appropriate size.

At the end of a sub-frame (i.e., an integration period), the image processing unit 106 (or other controller) provides a high pulse transfer control signal (Xfer) to the latch 212, to control the latch 212 to store the current count value of the ripple counter 210. In one embodiment, the latch 212 is a 6-bit latch; however, in other embodiments, the latch 212 may be of any appropriate size. By storing the count value of the ripple counter 210 in the latch 212 and subsequently resetting the count value of the ripple counter 210 to zero (e.g., via a Reset control signal provided to the ripple counter 210 by the image processing unit 106 or another controller), the digital unit cell 200 can begin to integrate charge over a new integration period without having to wait for the count value of the ripple counter 210 (from the previous integration period) to be read out. When desired by the image processing unit 106, a counter selection signal (Sel<5>) is provided to the counter selection circuit 214 to transfer the count value stored in the latch 212 to the image processing unit 106.

By applying a global correction term to the read-out count value of the ripple counter 210 of each unit cell 200 in the image sensor 120, the image processing unit 106 is able to determine the actual count value of each digital unit cell 200 (i.e., an actual count value that accounts for each count-up and count-down period during a sub-frame). For example, according to at least one embodiment, by subtracting the number of pulses (of the clock signal Ph1) at which the CountUp signal 205 provided to the multiplexer 206 of each unit cell 200 by the image processing unit 106 (or other controller) was low (i.e., indicating that each digital unit cell 200 should be counting down) from the read-out count value of the ripple counter 210 (via the latch 212) of each unit cell 200, the image processing unit 106 is able to determine the actual count value of each digital unit cell 200.

For example, referring to FIG. 3 in which the digital unit cell 200 performs only up-counting, after the Reset signal is provided to the ripple counter 210 (setting the count value of the ripple counter 210 to zero) and the integrator circuit 202 accumulates charge, a high CountUp signal is provided to the multiplexer 206 by the image processing unit 106 (or another controller). In response to the high CountUp signal, the multiplexer 206 couples the second output 209 of the comparator 204 to the ripple counter 210 and each time the second output 209 of the comparator 204 goes high (indicating that the voltage on the integration node is greater than a reference voltage), the count value of the ripple counter 210 is incremented. As shown in FIG. 3, the high CountUp signal is provided to the multiplexer 206 over the entire sub-frame.

While charge is being accumulated in the integrator circuit 202 during a current sub-frame (in response to radiation incident on the integrator circuit 202) and the count value of the ripple counter is being incremented each time the voltage on the integration node exceeds a threshold (and each time the charge on the integration node is removed by the charge subtraction circuit 208), a previous count value stored in the latch 212 during a previous sub-frame can be read-out by the image processing unit 106. In response to receiving a high signal (Sel<5>) at the counter selection circuit 214, the previously stored count value from the latch is transmitted to the image processing unit.

As shown in FIG. 3, at the end of the current sub-frame, the image processing unit 106 (or other controller) provides a high pulse transfer control signal (Xfer) to the latch 212, to control the latch 212 to store the current count value of the ripple counter 210 (e.g., 37). When desired (e.g., during a subsequent sub-frame) by the image processing unit 106, a counter selection signal (Sel<5) is provided to the counter selection circuit 214 to transfer the count value stored in the latch 212 to the image processing unit 106.

As the CountUp signal 205 provided to the multiplexer 206 was high over the entire sub-frame, the global correction term of the sub-frame (i.e., the number of pulses over the sub-frame at which the CountUp signal 205 provided to the multiplexer 206 by the image processing unit 106 was low) is zero. Accordingly, by subtracting the global correction term (0) from the count value read-out from the ripple counter 210 (37), the image processing unit 106 determines that the actual count value of the digital unit cell 200 is 37 (e.g., 37–0).

Referring to FIG. 4 in which the digital unit cell 200 performs only down-counting, after the Reset signal is provided to the ripple counter 210 (setting the count value of the ripple counter 210 to zero) and the integrator circuit 202 accumulates charge, a low CountUp signal is provided to the multiplexer 206 by the image processing unit 106 (or another controller). In response to the low CountUp signal, the multiplexer 206 couples the first output 207 of the comparator 204 to the ripple counter 210 and each time the first output 207 of the comparator 204 goes high (indicating that the voltage on the integration node is less than a reference voltage), the count value of the ripple counter 210 is incremented. As shown in FIG. 4, the low CountUp signal is provided to the multiplexer 206 over the entire sub-frame.

While charge is being accumulated in the integrator circuit 202 during a current sub-frame (in response to radiation incident on the integrator circuit 202) and the count value of the ripple counter is being incremented each time it is determined that the voltage on the integration node is less than a threshold, a previous count value stored in the latch 212 during a previous sub-frame can be read-out by the image processing unit 106. In response to receiving a high signal (Sel<5>) at the counter selection circuit 214, the previously stored count value from the latch is transmitted to the image processing unit.

As shown in FIG. 4, at the end of the current sub-frame, the image processing unit 106 (or other controller) provides a high pulse transfer (Xfer) signal to the latch 212, to control the latch 212 to store the current count value of the ripple counter 210 (e.g., 26). When desired (e.g., during a subsequent sub-frame) by the image processing unit 106, a counter selection signal (Sel<5>) is provided to the counter selection circuit 214 to transfer the count value stored in the latch 212 to the image processing unit 106.

As the CountUp signal 205 provided to the multiplexer 206 was low over the entire sub-frame (and the clock signal Ph1 included 63 pulses during the sub-frame), the global correction term of the sub-frame (i.e., the number of pulses at which the CountUp signal 205 provided to the multiplexer 206 by the image processing unit 106 was low) is 63. Accordingly, by subtracting the global correction term (63) from the count value read-out from the ripple counter 210 (26), the image processing unit 106 determines that the actual count value of the digital unit cell 200 is −37 (e.g., 26–63).

Referring to FIG. 5 in which the digital unit cell 200 performs both up-counting and down-counting, after the Reset signal is provided to the ripple counter 210 (setting the count value of the ripple counter 210 to zero) and the integrator circuit 202 accumulates charge, a high CountUp signal is provided to the multiplexer 206 by the image processing unit 106 (or another controller) over clock pulses 1-4. In response to the high CountUp signal, the multiplexer 206 couples the second output 209 of the comparator 204 to the ripple counter 210 and each time the second output 209 of the comparator 204 goes high (indicating that the voltage on the integration node is greater than a reference voltage), the count value of the ripple counter 210 is incremented. Over clock pulses 5-63, a low CountUp signal is provided to the multiplexer 206 by the image processing unit 106 (or another controller). In response to the low CountUp signal, the multiplexer 206 couples the first output 207 of the comparator 204 to the ripple counter 210 and each time the first output 207 of the comparator 204 goes high (indicating that the voltage on the integration node is less than a reference voltage), the count value of the ripple counter 210 is incremented.

While charge is being accumulated in the integrator circuit 202 during a current sub-frame (in response to radiation incident on the integrator circuit 202) and the count value of the ripple counter is being incremented in response to receiving a high Sub or high NoSub signal, a previous count value stored in the latch 212 during a previous sub-frame can be read-out by the image processing unit 106. In response to receiving a high signal (Sel<5>) at the counter selection circuit 214, the previously stored count value from the latch is transmitted to the image processing unit.

As shown in FIG. 5, at the end of the current sub-frame, the image processing unit 106 (or other controller) provides a high pulse transfer control signal (Xfer) to the latch 212, to control the latch 212 to store the current count value of the ripple counter 210 (e.g., 28). When desired (e.g., during a subsequent sub-frame) by the image processing unit 106, a counter selection signal (Sel<5>) is provided to the counter selection circuit 214 to transfer the count value stored in the latch 212 to the image processing unit 106.

As the CountUp signal 205 provided to the multiplexer 206 was low for 59 pulses (of the clock signal Ph1) during the sub-frame, the global correction term of the sub-frame (i.e., the number of pulses at which the CountUp signal 205 provided to the multiplexer 206 by the image processing unit 106 was low) is 59. Accordingly, by subtracting the global correction term (59) from the count value read-out from the ripple counter 210 (28), the image processing unit 106 determines that the actual count value of the digital unit cell 200 is −31 (e.g., 28–59).

According to other embodiments, during a sub-frame, a digital unit-cell may be configured to count-up for any desired number of pulses and count-down for any desired number of pulses.

By calculating the actual count value of a digital unit cell 200, the image processing unit 106 can more accurately define and/or analyze the radiation incident on the digital unit cell 200. By calculating the actual count value of each digital unit cell 200 in the image sensor 120, the image processing unit 106 can generate a more accurate picture of a scene viewed by the image sensor, especially in relation to known variables taken into account by the image processing unit 106 (e.g., by operating the unit cells 200 to count down).

According to at least one embodiment, the ripple counter 210 and the latch 212 are located on the same physical structure as the integrator circuit 202, the dynamic comparator 204, the charge subtraction circuit 208, and the multiplexer 206. However, according to at least one other embodiment, at least one of the ripple counter 210 and the latch 212 are located physically separate from the integrator circuit 202, the dynamic comparator 204, the charge subtraction circuit 208, and the multiplexer 206 (e.g., as similarly described in U.S. Pat. No. 9,154,713 entitled REPARTITIONED DIGITAL PIXEL, issued on Oct. 6, 2015, which is herein incorporated by reference in its entirety).

As described above, the digital unit cell 200 includes a ripple counter; however, in other embodiments, a different type of counter element may be utilized to maintain a count value.

As described above, a digital unit cell is provided that includes a relatively small, and low power, bidirectional ripple counter capable of both incrementing and decrementing a count value. A CountUp signal provided to the digital unit cell controls whether the digital unit cell is in a count-up or count-down state. In response to the CountUp signal indicating that the digital unit cell is in a count-up state, a count value of the ripple counter is incremented each time an integration voltage exceeds a threshold. In response to the CountUp signal indicating that the digital unit cell is in a count-down state, the count value of the ripple counter is incremented each time a determination is made that the integration voltage does not exceed the threshold. By subtracting a global correction term of a sub-frame (i.e., the number of pulses at which the CountUp signal provided to the digital unit cell indicates a count-down state) from the count value read-out from the ripple counter, the actual count value of the digital unit cell 200 can be determined.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A digital unit cell comprising:
   an integrator circuit configured to accumulate charge in response to radiation incident on the integrator circuit over an integration period;
   a dynamic comparator coupled to the integrator circuit, the dynamic comparator including a first output and a second output and configured to compare an integration voltage of the integrator circuit with a reference voltage over the integration period, provide a first pulse signal to the first output each time a determination is made that the integration voltage is less than the reference voltage, and provide a second pulse signal to the second output each time a determination is made that the integration voltage exceeds the reference voltage;
   a multiplexer coupled to the first output and the second output of the dynamic comparator and configured to receive a count direction control signal; and
   a counter element coupled to the multiplexer and configured to increment a count value each time the first pulse signal or the second pulse signal is received from the dynamic comparator over the integration period,
   wherein the multiplexer is configured to couple the first output of the dynamic comparator to the counter element in response to the count direction control signal being in a first state, and to couple the second output of the dynamic comparator to the counter element in response to the count direction control signal being in a second state.

2. The digital unit cell of claim 1, wherein the counter element is a ripple counter.

3. The digital unit cell of claim 1, further comprising a latch coupled to the counter element and configured to store the count value of the counter element in response to receiving a transfer control signal at an end of the integration period.

4. The digital unit cell of claim 3, wherein the counter element is further configured to reset the count value to zero in response to receiving a reset control signal at the end of the integration period.

5. The digital unit cell of claim 4, further comprising an image processing unit coupled to the counter selection circuit and configured to transmit the counter selection control signal to the counter selection circuit, receive the count value from the counter selection circuit, and calculate an actual count value of the digital unit cell based on the count value of the counter element and a global correction term.

6. The digital unit cell of claim 5, wherein the image processing unit is further configured to transmit the count direction control signal to the multiplexer.

7. The digital unit cell of claim 5, wherein the dynamic comparator is further configured to receive a clock signal including periodic pulses over the integration period and to compare the integration voltage of the integrator circuit with the reference voltage each time one of the pulses of the clock signal is received.

8. The digital unit cell of claim 7, wherein the global correction term is a number of pulses of the clock signal over the integration period at which the count direction control signal was in the first state.

9. The digital unit cell of claim 8, wherein in calculating the actual count value of the digital unit cell, the image processing unit is further configured to subtract the number of pulses over the integration period at which the count direction signal was in the first state from the count value.

10. The digital unit cell of claim 3, further comprising a counter selection circuit coupled to the latch and configured to provide the count value stored in the latch in response to receiving a counter selection control signal.

11. The digital unit cell of claim 1, further comprising a charge subtraction circuit coupled to the second output of the dynamic comparator and to the integrator circuit, the charge subtraction circuit configured to remove the accumulated charged from the integrator circuit in response to receiving the second pulse signal from the dynamic comparator.

12. A method for operating a digital unit cell comprising an integrator circuit, the method comprising:
   generating charge in response to radiation incident on the integrator circuit over an integration period;
   accumulating the charge on an integration node of the integrator circuit;
   comparing an integration voltage across the integration node with a reference voltage over the integration period;
   generating a first pulse signal each time a determination is made that the integration voltage is less than the reference voltage;
   generating a second pulse signal each time a determination is made that the integration voltage is greater than the reference voltage;
   receiving a count direction control signal;
   incrementing, in response to the count direction control signal being in a first state, a count value of a counter element each time the first pulse signal is generated; and
   incrementing, in response to the count direction control signal being in second state, the count value of a counter element each time the second pulse signal is generated.

13. The method of claim 12, further comprising storing, at an end of the integration period, the count value.

14. The method of claim 13, further comprising resetting, at the end of the integration period, the count value to zero.

15. The method of claim 13, further comprising reading-out the stored count value to an image processing unit.

16. The method of claim 15, further comprising calculating, with the image processing unit, an actual count value of the digital unit cell based on the read-out count value and a global correction term.

17. The method of claim 16, wherein comparing the integration voltage across the integration node with the reference voltage includes:
   receiving a clock signal including periodic pulses over the integration period; and
   comparing the integration voltage with the reference voltage at each pulse of the clock signal.

18. The method of claim 17, wherein calculating the actual count value of the digital unit cell based on the read-out count value and the global correction term includes calculating the actual count value of the digital unit cell by subtracting a number of clock pulses over the integration period at which the count direction signal was in the first state from the count value.

19. The method of claim 12, further comprising removing the accumulated charged from the integration node in response to generating the second pulse signal.

20. An image sensor comprising:
   An image processing unit; and
   An array of unit cells coupled to the image processing unit, each unit cell comprising:
   An integrator circuit configured to accumulate charge in response to radiation incident on the integrator circuit over an integration period;
   A dynamic comparator coupled to the integrator circuit, the dynamic comparator including a first output and a second output and configured to compare an integration voltage of the integrator circuit with a reference voltage over the integration period, provide a first pulse signal to the first output each time a determination is made that the integration voltage is less than the reference voltage, and provide a second pulse signal to the second output each time a determination is made that the integration voltage exceeds the reference voltage; and
   means for maintaining a counter value based on any received first pulse signals from the dynamic comparator, any received second pulse signals from the dynamic comparator, and a count direction control signal received from a controller;
   wherein the image processing unit is configured to read-out the counter value from each unit cell and calculate an actual count value of each unit cell based on the counter value of each unit cell and a global correction term.

* * * * *